US007424699B2

(12) United States Patent
O'Brien

(10) Patent No.: US 7,424,699 B2
(45) Date of Patent: Sep. 9, 2008

(54) MODIFYING SUB-RESOLUTION ASSIST FEATURES ACCORDING TO RULE-BASED AND MODEL-BASED TECHNIQUES

(75) Inventor: Sean C. O'Brien, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 278 days.

(21) Appl. No.: 11/150,624

(22) Filed: Jun. 10, 2005

(65) Prior Publication Data

US 2006/0281016 A1 Dec. 14, 2006

(51) Int. Cl.
*G06F 17/50* (2006.01)

(52) U.S. Cl. .................. 716/20; 716/8; 716/9; 716/10; 716/11; 716/19; 716/21; 430/5

(58) Field of Classification Search .............. 716/8–11, 716/19–21; 430/5
See application file for complete search history.

(56) References Cited

U.S. PATENT DOCUMENTS 6,335,130 B1 * 1/2002 Chen et al. ..................... 430/5
6,453,457 B1 * 9/2002 Pierrat et al. .................. 716/19
7,001,693 B2 * 2/2006 Liebmann et al. .............. 430/5
7,013,439 B2 * 3/2006 Robles et al. .................. 716/4
7,018,746 B2 * 3/2006 Cui et al. ....................... 430/5
7,200,835 B2 * 4/2007 Zhang et al. .................. 716/21
7,247,574 B2 * 7/2007 Broeke et al. ............... 438/725
2004/0005089 A1 * 1/2004 Robles et al. ............... 382/141
2004/0229133 A1 * 11/2004 Socha et al. ................... 430/5
2006/0075377 A1 * 4/2006 Broeke et al. ................ 716/19
2006/0147815 A1 * 7/2006 Melvin, III .................... 430/5
2006/0161452 A1 * 7/2006 Hess ............................ 705/1
2006/0236294 A1 * 10/2006 Saidin et al. ................. 716/19

OTHER PUBLICATIONS

UMC and Synopsys Develop Reference Flow for UMC's Advanced Deep Submicron Processes, Collaboration Validates Synopsys' Galaxy Design Platform for UMC's 0.13 micron Process, Synopsys, Inc., Corporate, Copyright © 2005 Synopsys, Inc., http://www.synopsys.com, 2 pages, May 3, 2004.
Mentor Graphics Calibre Approved Verification Tool for IBM-Chartered 90nm Design Enablement Platform, www.mentor.com, Copyright © 2002, Mentor Graphics Corporation, 8 pages, May 24, 2004.

(Continued)

*Primary Examiner*—Vuthe Siek
*Assistant Examiner*—Naum B Levin
(74) *Attorney, Agent, or Firm*—Wade J. Brady, III; Frederick J. Telecky, Jr.

(57) ABSTRACT

Modifying sub-resolution assist features includes receiving a mask pattern for a photolithographic mask. The mask pattern includes main features, and the photolithographic mask is operable to pattern a wafer pattern for a semiconductor wafer. Placement of sub-resolution assist features for the main features is estimated. The following is repeated for one or more iterations: correcting the main features using a wafer pattern model operable to estimate the wafer pattern; evaluating the sub-resolution assist features according to the wafer pattern model; and modifying at least one sub-resolution assist feature in accordance with the evaluation.

20 Claims, 2 Drawing Sheets

OTHER PUBLICATIONS

TSMC and Synopsys Address Design Challenges for 90 Nanometer and Below with TSMC Reference Flow 5.0, Synopsys, Inc., Corporate, Copyright © 2005 Synopsys, Inc., http://www.synopsys.com, 3 pages, Jun. 7, 2004.

MaskTools, Products/Profile, ASML MaskTools, Copyright © 2005 ASML, www. masktools.com, 13 pages, 2005.

Hercules Physical Verification Suite (PVS) The Industry's Fastest Physical Verification Solution, Synopsys, Inc., Products & Solutions, Copyright © 2005 Synopsys, Inc., http://www.synopsys.com, 4 pages, Jan. 6, 2005.

Product Overview, K2 Technologies, Copyright © 1995-2004, Cadence Design Systems, Inc. , 37 pages, Printed 2005.

Pending U.S. Appl. No. 11/114,558, filed Apr. 26, 2005, entitled "Merging Sub-Resolution Assist Features Of A Photolithographic Mask", 39 pages specification, claims and abstract, 3 pages of drawings, inventors Sean C. O'Brien et al.

Pending U.S. Appl. No. 11/114,582, filed Apr. 26, 2005, entitled "Modifying Merged Sub-Resolution Assist Features Of A Photolithographic Mask", 40 pages specification, claims and abstract, 3 pages of drawings, inventors Sean C. O'Brien et al.

* cited by examiner

MODIFYING SUB-RESOLUTION ASSIST FEATURES ACCORDING TO RULE-BASED AND MODEL-BASED TECHNIQUES

TECHNICAL FIELD

This invention relates generally to the field of photolithography and more specifically to modifying sub-resolution assist features according to rule-based and model-based techniques.

BACKGROUND

Masks are used to define patterns on objects. For example, photomasks are used in photolithographic systems to define patterns on semiconductor wafers to manufacture integrated circuits. Processing situations, however, may distort the resulting pattern defined on the object. For example, optical diffraction may cause the pattern defined on a wafer to differ from the pattern of the mask.

A mask may include features that compensate for distortions of a resulting pattern on a wafer. According to a known technique for compensating distortions, a mask may include sub-resolution assist features (SRAFs). An SRAF is designed to improve the process margin of a resulting wafer pattern, but not to be printed on the wafer. In certain situations, however, the SRAFs may be unsatisfactory. For example, the SRAFs may print on a wafer or may violate mask rules. It is generally desirable to have satisfactory SRAFs.

SUMMARY OF THE DISCLOSURE

In accordance with the present invention, disadvantages and problems associated with previous techniques for modifying SRAFs may be reduced or eliminated.

According to one embodiment of the present invention, modifying sub-resolution assist features includes receiving a mask pattern for a photolithographic mask. The mask pattern includes main features, and the photolithographic mask is operable to pattern a wafer pattern for a semiconductor wafer. Placement of sub-resolution assist features for the main features is estimated. The following is repeated for one or more iterations: correcting the main features using a wafer pattern model operable to estimate the wafer pattern; evaluating the sub-resolution assist features according to the wafer pattern model; and modifying at least one sub-resolution assist feature in accordance with the evaluation.

Certain embodiments of the invention may provide one or more technical advantages. A technical advantage of one embodiment may be initial placement of the SRAFs may be estimated using design rules. Main features of the mask may be corrected using a wafer pattern model. The SRAFs may be evaluated using the wafer pattern model, and modified according to the evaluation. Modifying the SRAFs according to the evaluation may help to reduce degradation of the process margin.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
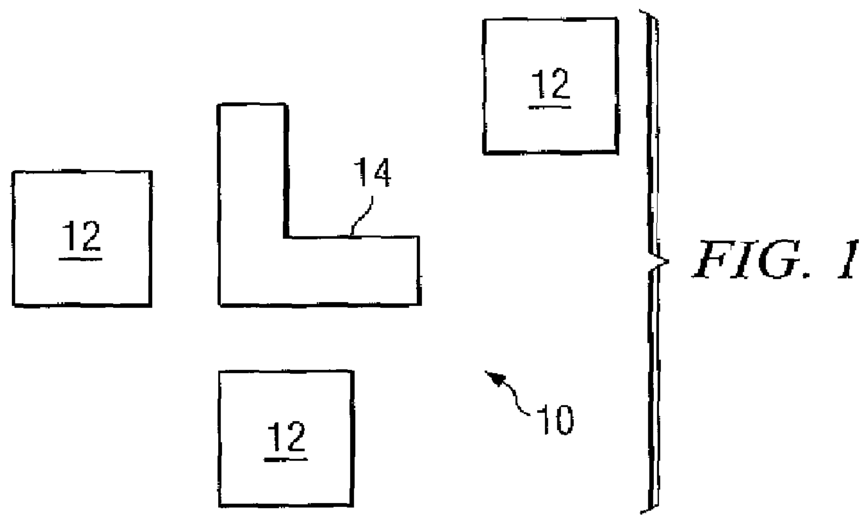
FIG. 1 is a diagram illustrating an example pattern for a mask that includes sub-resolution assist features (SRAFs) that may be modified according to one embodiment of the invention.
Figure 2:
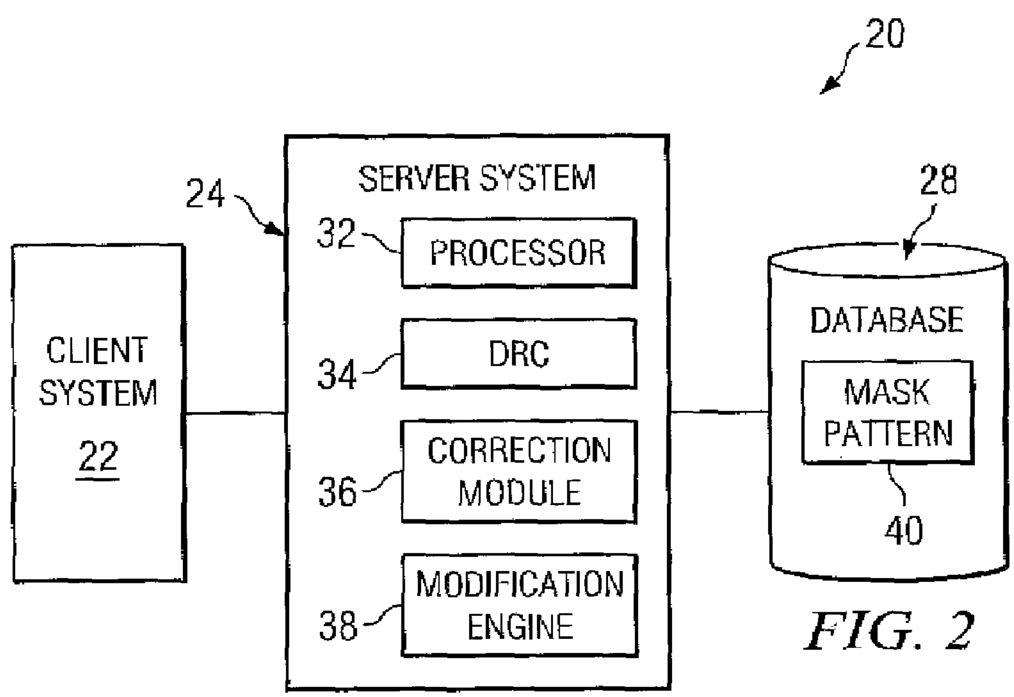
FIG. 2 is a block diagram illustrating one embodiment of a system operable to modify SRAFs.
Figure 3:
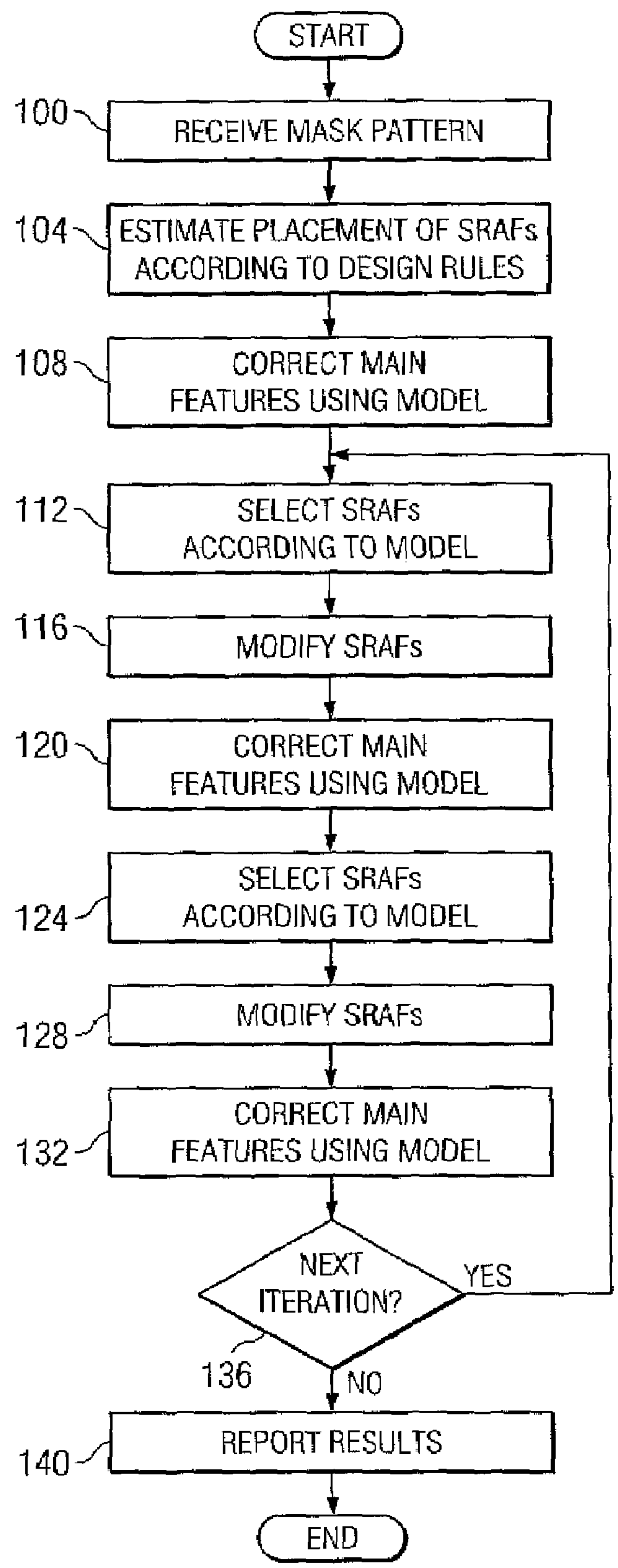
FIG. 3 is a flowchart illustrating one embodiment of a method for modifying SRAFs that may be used by the system of FIG. 2.

Embodiments of the present invention and its advantages are best understood by referring to FIGS. 1 through 3 of the drawings, like numerals being used for like and corresponding parts of the various drawings.

FIG. 1 is a diagram illustrating an example pattern 10 for a mask that includes sub-resolution assist features (SRAFs) that may be modified according to one embodiment of the invention. According to the embodiment, initial placement of the SRAFs may be estimated using design rules. Main features of the mask may be corrected using a wafer pattern model. The SRAFs may be evaluated using the wafer pattern model, and modified according to the evaluation. Modifying the SRAFs according to the evaluation may help to reduce degradation of the process margin.

A mask may refer to a photomask used in a photolithographic system to define a pattern on an object such as a semiconductor wafer to form an integrated circuit. Typically, a mask is placed between a light source and the object. The mask selectively blocks, transmits, or otherwise modifies light from the light source to define a pattern on the object. A mask pattern may refer to a pattern of all or a portion of the mask that defines the pattern on the object.

A mask has a background on which features are defined. A dark field mask has an opaque background on which clear features are defined. A clear feature may refer to a feature that substantially transmits light through an otherwise opaque mask. A clear field mask has a clear background on which opaque features are defined. An opaque feature may refer to a feature that substantially blocks light from passing through an otherwise transparent mask.

Clear portions may comprise any suitable substantially transparent material operable to substantially transmit light. For example, clear portions may comprise glass, film, other suitable clear material, or any combination of the preceding. Opaque portions may comprise any suitable substantially opaque material operable to substantially block light. For example, opaque portions may comprise silver, chrome, chrome oxide, iron oxide, copper, aluminum, silicon oxide, other suitable opaque material, or any combination of the preceding.

According to the illustrated embodiment, example mask pattern 10 includes opaque features such as main features 12 and SRAFs 14. A main feature may refer to a feature of a mask that is designed to yield a printed main feature on a wafer. The capability of a feature to yield a printed feature on a wafer may be referred to as printability. Accordingly, a main feature may refer to a feature that is designed to be printable.

According to one embodiment, main feature 12 may represent an opaque feature such as a gate of a transistor. In the illustrated example, the transverse axis of each gate is substantially parallel to an x-axis, and the longitudinal axis of each gate is substantially parallel to an y-axis. For gates, the distance between gates in the x-direction is more important the distance between gates in the y-direction. Although main feature 12 is described as representing a gate, main feature 12 may represent any suitable feature of a mask that is designed to be printable. For example, main feature 12 may represent a contact hole, a metal line, or a piece of transistor silicon.

Example mask pattern 10 also includes SRAF 14. An SRAF may refer to a feature of a mask that is designed to improve the process margin of a printed main feature on a wafer, but not to yield a printed feature on the wafer. That is, an SRAF may refer to a feature that is designed to be not printable. Process margin refers to the range of exposure dose and defocus over which acceptable image size tolerances can be maintained. According to one embodiment, an SRAF 14 may comprise a grating that scatters light away from a printed main feature 12 of the wafer. SRAF 14, however, may represent any suitable feature of a mask that is designed to be not printable. For example, SRAF 14 may comprise a rectangular glass aperture on a dark field chrome mask.

SRAFs 14 may be modified to improve the process margin of the mask pattern. Modification of an SRAF 14 may refer to changing a geometric feature of at least a portion of the SRAF 14. A geometric feature may refer to size, shape, location, placement, other feature, or any combination of the preceding. SRAFs 14 may be modified in any suitable manner. As an example, at least a portion of an SRAF 14 may be made longer, shorter, wider, narrower, larger, smaller, or otherwise changed. As another example, at least a portion of an SRAF 14 may be removed, added, or otherwise changed. As yet another example, SRAFs 14 may be merged. Merging SRAFs 14 may refer to coupling SRAFs 14 with a material having similar properties as those of SRAFs 14 to form, in effect, one feature. As yet another example, an SRAF 14 may be moved, such as translated or rotated or both translated and rotated.

SRAFs 14 may be selected for modification for any suitable reason. As an example, SRAFs 14 may be modified if SRAFs 14 violate a rule. A rule may refer to a mask rule, process rule, etch rule, SRAF rule, or any other suitable rule. For example, SRAFs 14 may be merged if the space between SRAFs 14 is less than a minimum spacing threshold. A minimum spacing threshold may define the minimum acceptable distance between features of a mask. As another example, SRAFs 14 may be modified to simplify a mask or printing pattern. As another example, SRAFs 14 may be modified if they are printable. SRAFs 14 that are shaped like a rectangle, square, or L are typically not printable. SRAFs 14 of other shapes, however, may be printable. Accordingly, these SRAFs 14 may be adjusted to avoid yielding a printed feature.

According to one embodiment, initial placement of the SRAFs may be estimated using design rules. Main features of the mask may be corrected using a wafer pattern model. The SRAFs may be evaluated using the wafer pattern model, and modified according to the evaluation. Modifying the SRAFs according to the evaluation may help to reduce degradation of the process margin.

Example pattern 10 is presented as an example only. Modifications, additions, or omissions may be made to pattern 10 without departing from the scope of the invention. Pattern 10 may include more, fewer, or other features. Additionally, features may arranged in any suitable manner without departing from the scope of the invention.

FIG. 2 is a block diagram illustrating one embodiment of a system 20 operable to modify SRAFs 14. According to the embodiment, system 20 may use design rules to estimate initial placement of SRAFs 14. System 20 may use a wafer pattern model to correct main features of the mask and evaluate the SRAFs 14, and may modify the SRAFs according to the evaluation. Modifying the SRAFs 14 according to the evaluation may help to reduce degradation of the process margin.

According to the illustrated embodiment, system 20 includes a client system 22, a server system 24, and a database 28 coupled as shown. According to one embodiment, client system 22 allows a user to communicate with server system 24 to execute applications that may be used to modify SRAFs 14. Client system 22 may include any hardware, software, other logic, or any combination of the preceding for communicating with server system 24, and may use any of a variety of computing structures, arrangements, and compilations to communicate with server system 24.

Server system 24 manages applications 30 that may be used to modify SRAFs 14. Server system 24 may include any hardware, software, other logic, or any combination of the preceding for managing applications 30, and may use any of a variety of computing structures, arrangements, and compilations to manage applications 30.

According to the illustrated embodiment, server system 24 includes a processor 32 operable to execute one or more applications 30.

According to the illustrated embodiment, applications 30 include a design rule checker (DRC) 34, a correction module 36, and a modification engine 38. Design rule checker 34 applies a set of design rules to a mask pattern. A design rule may refer to a requirement that a mask pattern may be required to satisfy. Design rules are typically designed to yield a satisfactory mask that yields a satisfactory pattern on a wafer. A rule may pose a geometric requirement. As an example, a rule may define a minimum spacing threshold between two features. As another example, a rule may define a minimum width threshold for a feature. Example design rules may include mask rules, SRAF rules, process rules, other suitable rules, or any combination of the preceding.

According to one embodiment, design rule checker 34 may apply rules to a pattern 10 that includes main features 12 in order to estimate initial placement of SRAFs 14. According to the embodiment, a rule may state that if the pitch between two features 12 is x, then a number n of SRAFs may be placed between the two features. For example, if $0<x<360$ nanometers, then $n=0$; $361<x<570$ nanometers, then $n=1$; and $571<x<720$ nanometers, then $n=2$. The initial positions of SRAFs 14, however, may be estimated in any suitable manner.

Correction module 36 may adjust mask pattern 10 to compensate for deviations that may occur during the manufacturing process of an integrated circuit. Deviations may result from, for example, optical diffraction, etch effects, mask-making effects, resist effects, or other effects occurring during the manufacturing process.

According to one embodiment, correction module 36 may use a wafer pattern model to compensate for deviations. A wafer pattern model models the final pattern defined on the wafer, and may be used to predict the final pattern defined on the wafer given a specific mask pattern. Typical wafer pattern models may include optical proximity correction models that compensate for distortions resulting from optical diffraction.

Modification engine 38 modifies SRAFs 14. According to one embodiment, modification engine 38 may use design rules to estimate initial placement of SRAFs 14. Modification engine 38 may use a wafer pattern model to correct main features of the mask and evaluate the SRAFs, and may modify the SRAFs 14 according to the evaluation. Modifying the SRAFs 14 according to the evaluation may help to reduce degradation of the process margin. Modification engine 38 may use any suitable method to modify SRAFS. An example method is described in more detail with reference to FIG. 3.

Database 28 may include any hardware, software, other logic, or combination of the preceding for storing and facilitating retrieval of information used by server system 24. Also, database 28 may use any of a variety of data structures, arrangements, and compilations to store and facilitate retrieval of information used by server system 24.

According to the illustrated embodiment, database 28 stores a mask pattern 40. Mask pattern 40 may represent a pattern for a photolithographic mask for patterning a wafer to produce an integrated circuit. Mask pattern 40 may include main features 12 and SRAFs 14. Mask pattern 40 may be generated from a design that indicates features to be patterned on a wafer. Mask pattern 40 may undergo optical proximity correction processing to compensate for distortions before or after or both before and after SRAFs 14 are modified.

Client system 22, server system 24, and database 28 may operate on one or more computers and may include appropriate input devices, output devices, storage media, processors, memory, or other components for receiving, processing, storing, and communicating information according to the operation of system 20. For example, the functions of client system 22, server system 24, database 28, or any combination of the preceding may be provided using a single computer system, for example, a personal computer. As used in this document, the term "computer" refers to any suitable device operable to execute instructions and manipulate data to perform operations, for example, a personal computer, work station, network computer, wireless telephone, personal digital assistant, one or more microprocessors within these or other devices, or any other suitable processing device.

Modifications, additions, or omissions may be made to system 20 without departing from the scope of the invention. For example, client system 22, server system 24, and database 28 may be integrated or separated according to particular needs. If any of client system 22, server system 24, and database 28 are separated, the separated components may be coupled to each other using a local area network (LAN), a metropolitan area network (MAN), a wide area network (WAN), a global computer network such as the Internet, or any other appropriate wire line, wireless, or other link.

Moreover, the operations of system 20 may be performed by more, fewer, or other modules. For example, the operations of design rule checker 34 and modification engine 38 may be performed by one module, or the operations of modification engine 38 may be performed by more than one module. Additionally, operations of system 10 may be performed using any suitable logic comprising software, hardware, other logic, or any suitable combination of the preceding. As used in this document, "each" refers to each member of a set or each member of a subset of a set.

FIG. 3 is a flowchart illustrating one embodiment of a method for modifying SRAFs 14 that may be used by modification engine 38 of FIG. 2. The method begins at step 100, where system 10 receives mask pattern 40. Mask pattern 40 may include main features 12 designed to pattern a wafer.

Placement of SRAFs 14 is estimated according to design rules at step 104. SRAFs 14 may be used to improve the process margin of main features 12. According to one embodiment, design rule checker 34 may estimate the initial positions of SRAFs 14 such that SRAF and mask rules are satisfied. Main features 12 are corrected using a model at step 108. The correction takes into account the placement of SRAFs 14. According to one embodiment, correction module 36 may correct main features 12 using a wafer pattern model.

SRAFs 14 are selected for modification in accordance with the model to be modified at step 112. The SRAFs 14 may be selected in any suitable manner. According to one embodiment, the wafer pattern model may be used to identify SRAFs 14 that are printable. According to the embodiment, the model intensity of the SRAFs 14 is calculated using the wafer pattern model. SRAFs 14 with a model intensity that is above a minimum printing threshold may be identified as printable, and may be selected for modification. The SRAFs 14 may be selected in any other suitable manner. For example, feature analysis or historical data may be used to identify geometric features of SRAFs 14 that are typically printable.

The selected SRAFs 14 are modified at steps 116. SRAFs 14 may be modified in any suitable manner. According to one embodiment, SRAFs 14 may be modified according to design rules such as mask rules. According to the embodiment, design rule checker 36 may apply the mask rules to the selected SRAFs 14 to modify SRAFs 14. For example, the parts of SRAFs 14 that are printable may be removed. Main features 12 are corrected using the model at step 120. The correction takes into account the modified SRAFs 14.

SRAFs 14 are selected for modification in accordance with the model at step 124. According to one embodiment, SRAFs 14 may be evaluated using the wafer pattern model, and SRAFs 14 may be selected in accordance with the evaluation. According to the embodiment, an SRAF 14 may be evaluated according to its ability to improve image quality of an associated main feature 12. An associated main feature 12 of an SRAF 14 may refer to a main feature 12 that SRAF 14 is designed to improve. Typically, an SRAF 14 is proximate to its associated main feature 12.

According to the embodiment, the image quality of the main feature may be established using any suitable image quality parameter. An image quality parameter may refer to a parameter that indicates the quality of the pattern formed by a main feature. An image quality parameter may represent the normalized image log slope (NILS), image slope, brightness, other quality, or any combination of the preceding. An image quality parameter that fails to satisfy a threshold may indicate that the image quality is not satisfactory.

As an example, the first derivative of the model image, or the image slope, of the edges of a main feature 12 with an associated SRAF 14 may be calculated. A minimum slope threshold may indicate a minimum allowable first derivative value that yields a satisfactory contrast ratio for an edge of a feature. If first derivative is less than the minimum slope threshold, the associated SRAF 14 may be selected for modification.

The selected SRAFs 14 are modified at step 128. SRAFs 14 may be modified to improve the printing margin of associated main features 12. According to one embodiment, SRAF 14 may be moved. The distance and direction of the movement may be established in any suitable manner. For example, the distance may be established from the second derivative of the model image. SRAF 14 may be moved towards and away from the edge of associated main feature 12 to determine the distance that optimizes the second derivative. The direction may be calculated from the first derivative of the model image. SRAF 14 may be moved in the calculated distance in a direction that optimizes the first derivative of the image. Main features 12 are corrected using the model at step 132. The correction takes into account the modified SRAFs 14.

Steps 112-132 may be repeated for any suitable number of iterations. According to one embodiment, the steps 112-132 may be repeated for a predetermined number of iterations. The predetermined number may be selected in accordance with available computational time, desired optical proximity correction, other suitable criteria, or any combination of the preceding. According to another embodiment, steps 112-132 may be repeated until a certain threshold is reached. As an example, the steps may be repeated until the final optical proximity correction satisfies a proximity correction threshold. As another example, the steps may be repeated until the number of rule violations of the mask pattern satisfies a rule violation threshold.

If there is a next iteration at step 136, the method returns to step 112 to select SRAFs 14 to modify during the next iteration. If there is no next iteration at step 136, the method proceeds to step 140. The results are reported at step 140. After reporting the results, the method terminates.

Modifications, additions, or omissions may be made to the method without departing from the scope of the invention. The method may include more, fewer, or other steps. Additionally, steps may be performed in any suitable order without departing from the scope of the invention.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A method of modifying a plurality of sub-resolution assist features, comprising:

receiving a mask pattern for a photolithographic mask, the mask pattern comprising one or more main features, the photolithographic mask operable to pattern a wafer pattern for a semiconductor wafer;

estimating placement of one or more sub-resolution assist features for the one or more main features; then repeating the following for one or more iterations:

correcting the one or more main features using a wafer pattern model, the wafer pattern model operable to estimate the wafer pattern;

evaluating the one or more sub-resolution assist features according to the wafer pattern model and comprising:

establishing a first derivative of a model image of a main feature having an associated sub-resolution assist feature;

determining that the first derivative of the model image is less than a minimum slope threshold; and selecting the associated sub-resolution assist feature as the at least one sub-resolution assist feature to modify; and modifying at least one sub-resolution assist feature of the one or more sub-resolution assist features in accordance with the evaluation.

2. The method of claim 1, wherein estimating the placement of the one or more sub-resolution assist features for the one or more main features further comprises:

estimating placement of the one or more sub-resolution assist features according to a design rule.

3. The method of claim 1, wherein modifying the at least one sub-resolution assist feature of the one or more sub-resolution assist features in accordance with the evaluation further comprises:

modifying the at least one sub-resolution assist feature according to a design rule.

4. The method of claim 1, wherein evaluation the one or more sub-resolution assist features according to the wafer pattern model further comprises:

identifying a sub-resolution assist feature that is printable; and selecting the identified sub-resolution assist feature as the at least one sub-resolution assist feature to modify.

5. The method of claim 1, wherein evaluating the one or more sub-resolution assist features according to the wafer pattern model further comprises:

identifying a sub-resolution assist feature that violates a design rule; and selecting the identified sub-resolution assist feature as the at least one sub-resolution assist feature to modify.

6. The method of claim 1 wherein evaluating the one or more sub-resolution assist features according to the wafer pattern model further comprises:

establishing an image quality of a main feature having an associated sub-resolution assist feature;

determining that the image quality is not satisfactory; and selecting the associated sub-resolution assist feature as the at least one sub-resolution assist feature to modify.

7. The method of claim 1, wherein:

modifying the at least one sub-resolution assist feature of the one or more sub-resolution assist features in accordance with the evaluation further comprises extending the at least one sub-resolution assist feature.

8. The method of claim 1, wherein modifying the at least one sub-resolution assist feature of the one or more sub-resolution assist features in accordance with the evaluation further comprises:

establishing a first derivative of a model image of a main feature having an associated sub-resolution assist feature;

establishing a second derivative of the model image;

estimating a distance from the second derivative;

estimating a direction from the first derivative; and moving the associated sub-resolution assist feature in the distance and the direction.

9. Software for modifying a plurality of sub-resolution assist features, the software embodied as a computer-executable program stored in a computer-readable device and operable to:

receive a mask pattern for a photolithographic mask, the mask pattern comprising one or more main features, the photolithographic mask operable to pattern a wafer pattern for a semiconductor wafer;

estimate placement of one or more sub-resolution assist features for the one or more main features; then repeat the following for one or more iterations:

correct the one or more main features using a wafer pattern model, the wafer pattern model operable to estimate the wafer pattern;

evaluate the one or more sub-resolution assist features according to the wafer pattern model by:

establishing a first derivative of a model image of a main feature having an associated sub-resolution assist feature;

determining that the first derivative of the model image is less than a minimum slope threshold; and selecting the associated sub-resolution assist feature as the at least one sub-resolution assist feature to modify; and modify at least one sub-resolution assist feature of the one or more sub-resolution assist features in accordance with the evaluation.

10. The software of claim 9, further operable to estimate the placement of the one or more sub-resolution assist features for the one or more main features by:

estimating placement of the one or more sub-resolution assist features according to a design rule.

11. The software of claim 9, further operable to modify the at least one sub-resolution assist feature of the one or more sub-resolution assist features in accordance with the evaluation by:

modifying the at least one sub-resolution assist feature according to a design rule.

12. The software of claim 9, further operable to evaluate the one or more sub-resolution assist features according to the wafer pattern model by:

identifying a sub-resolution assist feature that is printable; and selecting the identified sub-resolution assist feature as the at least one sub-resolution assist feature to modify.

13. The software of claim 9, further operable to evaluate the one or more sub-resolution assist features according to the wafer pattern model by:

identifying a sub-resolution assist feature that violates a design rule; and selecting the identified sub-resolution assist feature as the at least one sub-resolution assist feature to modify.

14. The software of claim 9, further operable to evaluate the one or more sub-resolution assist features according to the wafer pattern model by:

establishing an image quality of a main feature having an associated sub-resolution assist feature;

determining that the image quality is not satisfactory; and selecting the associated sub-resolution assist feature as the at least one sub-resolution assist feature to modify.

15. The software of claim 9, further operable to:

modify the at least one sub-resolution assist feature of the one or more sub-resolution assist features in accordance with the evaluation by extending the at least one sub-resolution assist feature.

16. The software of claim 9, further operable to modify the at least one sub-resolution assist feature of the one or more sub-resolution assist features in accordance with the evaluation by:

establishing a first derivative of a model image of a main feature having an associated sub-resolution assist feature;

establishing a second derivative of the model image;

estimating a distance from the second derivative;

estimating a direction from the first derivative; and moving the associated sub-resolution assist feature in the distance and the direction.

17. A method of modifying a plurality of sub-resolution assist features, comprising:

receiving a mask pattern for a photolithographic mask, the mask pattern comprising one or more main features, the photolithographic mask operable to pattern a wafer pattern for a semiconductor wafer;

estimating placement of one or more sub-resolution assist features for the one or more main features according to a design rule; and repeating the following for one or more iterations:

correcting the one or more main features using a wafer pattern model, the wafer pattern model operable to estimate the wafer pattern;

evaluating the one or more sub-resolution assist features according to the wafer pattern model, evaluating the one or more sub-resolution assist features according to the wafer pattern model further comprising:

identifying a first sub-resolution assist feature that is printable;

selecting the first sub-resolution assist feature to modify;

identifying a second sub-resolution assist feature that violates a design rule;

selecting the second identified sub-resolution assist feature to modify;

establishing an image quality of a main feature having a third sub-resolution assist feature;

determining that the image quality is not satisfactory;

selecting the third sub-resolution assist feature to modify;

establishing a first derivative of a model image of a main feature having a fourth sub-resolution assist feature;

determining that the first derivative of the model image is less than a minimum slope threshold;

selecting the fourth sub-resolution assist feature to modify;

establishing a first derivative of a model image of a main feature having a fifth sub-resolution assist feature;

determining that the first derivative of the model image associated with the fifth sub-resolution assist feature is less than a minimum slope threshold; and selecting the fifth sub-resolution assist feature to modify; and modifying at least one sub-resolution assist feature of the one or more sub-resolution assist features in accordance with the evaluation using a design rule, modifying the at least one sub-resolution assist feature further comprising:

extending the fifth sub-resolution assist feature;

establishing a first derivative of a model image of a main feature having a sixth sub-resolution assist feature;

establishing a second derivative of the model image associated with the sixth sub-resolution assist feature;

estimating a distance from the second derivative associated with sixth sub-resolution assist feature;

estimating a direction from the first derivative associated with sixth sub-resolution assist feature; and moving the sixth sub-resolution assist feature in the distance and direction.

18. A method of modifying a plurality of sub-resolution assist features, comprising:

receiving a mask pattern for a photolithographic mask, the mask pattern comprising one or more main features, the photolithographic mask operable to pattern a wafer pattern for a semiconductor wafer;

estimating placement of one or more sub-resolution assist features for the one or more main features; and repeating the following for one or more iterations:

correcting the one or more main features using a wafer pattern model, the wafer pattern model operable to estimate the wafer pattern;

evaluating the one or more sub-resolution assist features according to the wafer pattern model, wherein evaluating the one or more sub-resolution assist features according to the wafer pattern model further comprises:

establishing a first derivative of a model image of a main feature having an associated sub-resolution assist feature;

determining that the first derivative of the model image is less than a minimum slope threshold; and selecting the associated sub-resolution assist feature as the at least one sub-resolution assist feature to modify; and modifying at least one sub-resolution assist feature of the one or more sub-resolution assist features in accordance with the evaluation.

19. The method of claim 18, wherein modifying the at least one sub-resolution assist feature of the one or more sub-resolution assist features in accordance with the evaluation further comprises extending the at least one sub-resolution assist feature.

20. A method of modifying a plurality of sub-resolution assist features, comprising:

receiving a mask pattern for a photolithographic mask, the mask pattern comprising one or more main features, the photolithographic mask operable to pattern a wafer pattern for a semiconductor wafer;

estimating placement of one or more sub-resolution assist features for the one or more main features; and repeating the following for one or more iterations:

correcting the one or more main features using a wafer pattern model, the wafer pattern model operable to estimate the wafer pattern;

evaluating the one or more sub-resolution assist features according to the wafer pattern model; and modifying at least one sub-resolution assist feature of the one or more sub-resolution assist features in accordance with the evaluation, wherein modifying the at least one sub-resolution assist feature of the one or more sub-resolution assist features in accordance with the evaluation further comprises:

establishing a first derivative of a model image of a main feature having an associated sub-resolution assist feature;

establishing a second derivative of the model image;

estimating a distance from the second derivative;

estimating a direction from the first derivative; and moving the associated sub-resolution assist feature in the distance and the direction.

* * * * *